United States Patent
Shao

(10) Patent No.: US 12,414,286 B2
(45) Date of Patent: Sep. 9, 2025

(54) SEMICONDUCTOR STRUCTURE AND FORMATION METHOD THEREOF

(71) Applicant: CHANGXIN MEMORY TECHNOLOGIES, INC., Hefei (CN)

(72) Inventor: Guangsu Shao, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 482 days.

(21) Appl. No.: 17/952,208

(22) Filed: Sep. 24, 2022

(65) Prior Publication Data
US 2023/0020232 A1 Jan. 19, 2023

(30) Foreign Application Priority Data
Jun. 24, 2022 (CN) .......................... 202210730447.9

(51) Int. Cl.
*H10B 12/00* (2023.01)
(52) U.S. Cl.
CPC ........... *H10B 12/05* (2023.02); *H10B 12/315* (2023.02); *H10B 12/482* (2023.02)
(58) Field of Classification Search
CPC .... H10B 12/05; H10B 12/315; H10B 12/482; H10B 12/488; H10B 12/30
See application file for complete search history.

(56) References Cited

U.S. PATENT DOCUMENTS

| 2006/0097304 | A1 | 5/2006 | Yoon et al. | |
| 2011/0121396 | A1* | 5/2011 | Lee | G11C 11/403 |
| | | | | 257/E29.264 |
| 2016/0380060 | A1* | 12/2016 | Kim | H01L 21/764 |
| | | | | 438/586 |

* cited by examiner

*Primary Examiner* — Marlon T Fletcher
*Assistant Examiner* — Samuel Jonathan Smith
(74) *Attorney, Agent, or Firm* — Kilpatrick Townsend & Stockton LLP

(57) ABSTRACT

Embodiments provide a semiconductor structure and a formation method thereof. The semiconductor structure includes: a substrate provided with semiconductor pillars arranged at intervals, the semiconductor pillars including a first doped region, a channel region and a second doped region sequentially arranged along a direction distant from a surface of the substrate; and a plurality of word lines extending along a first direction and an insulating layer between adjacent word lines. Each word line surrounds the channel region of the semiconductor pillars arranged along the first direction, and along the direction distant from the surface of the substrate, a width of the insulating layer perpendicular to the first direction gradually decreases. The embodiments are at least advantageous to ensuring that the word lines have better continuity.

16 Claims, 10 Drawing Sheets

SEMICONDUCTOR STRUCTURE AND FORMATION METHOD THEREOF

CROSS-REFERENCE TO RELATED APPLICATION

This application claims priority to Chinese Patent Application No. 202210730447.9, titled "SEMICONDUCTOR STRUCTURE AND FORMATION METHOD THEREOF" and filed to the State Patent Intellectual Property Office on Jun. 24, 2022, the entire contents of which are incorporated herein by reference.

TECHNICAL FIELD

Embodiments of the present disclosure relate to the field of semiconductor technology, and more particularly, to a semiconductor structure and a formation method thereof.

BACKGROUND

As a dynamic memory develops toward a direction of higher integration density, there are higher requirements on arrangement of transistors and sizes of the transistors in a dynamic memory array structure. When a gate-all-around transistor structure is used as a transistor in the dynamic memory, a smaller pattern size may be obtained under a given process condition, which is advantageous to increasing the integration density of the dynamic memory.

While research is performed on the arrangement of the dynamic memory structure and how to reduce the size of the dynamic memory structure, it is also required to improve structural stability of the dynamic memory. With miniature of the dynamic memory structure, sizes of word lines in the dynamic memory structure are also continuously reduced, and the smaller-sized word lines have a problem of poorer continuity.

SUMMARY

A semiconductor structure and a formation method thereof provided by embodiments of the present disclosure are at least advantageous to ensuring that word lines have better continuity.

In one aspect, the embodiments of the present disclosure provide a semiconductor structure, which includes: a substrate, where the substrate is provided with a plurality of semiconductor pillars arranged at intervals, and the plurality of semiconductor pillars include a first doped region, a channel region and a second doped region sequentially arranged along a direction distant from a surface of the substrate; and a plurality of word lines extending along a first direction and an insulating layer between adjacent word lines, where each of the word lines surrounds the channel region of the plurality of semiconductor pillars arranged along the first direction, and along the direction distant from the surface of the substrate, a width of the insulating layer perpendicular to the first direction gradually decreases.

Correspondingly, another aspect of the embodiments of the present disclosure further provides a method for forming a semiconductor structure. The method includes: providing a substrate, where the substrate is provided with a plurality of semiconductor pillars arranged at intervals, the plurality of semiconductor pillars include a first doped region, a channel region and a second doped region sequentially arranged along a direction distant from a surface of the substrate; and forming a plurality of word lines extending along a first direction and an insulating layer between adjacent word lines, where each of the plurality of word lines surrounds the channel region of the plurality of semiconductor pillars arranged along the first direction, and along the direction distant from the surface of the substrate, a width of the insulating layer perpendicular to the first direction gradually decreases.

BRIEF DESCRIPTION OF THE DRAWINGS

Exemplary descriptions are made to one or more embodiments with reference to pictures in the corresponding drawings, and these exemplary descriptions do not constitute limitations on the embodiments. Unless otherwise stated, the figures in the accompanying drawings do not constitute a scale limitation. To describe the technical solutions of the embodiments of the present disclosure or those of the prior art more clearly, the accompanying drawings required for describing the embodiments will be briefly introduced below. Apparently, the accompanying drawings in the following description are merely some embodiments of the present disclosure. To those of ordinary skills in the art, other accompanying drawings may also be derived from these accompanying drawings without creative efforts.

DETAILED DESCRIPTION

As can be known from the background art, smaller-sized word lines have a problem of poorer continuity.

Figure 1:
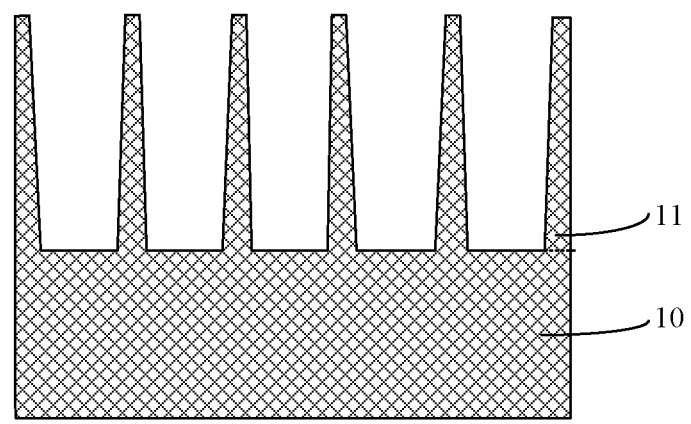
FIGS. 1 to 4 are schematic diagrams of each step of a method for forming a semiconductor structure in the prior art.
Figure 2:
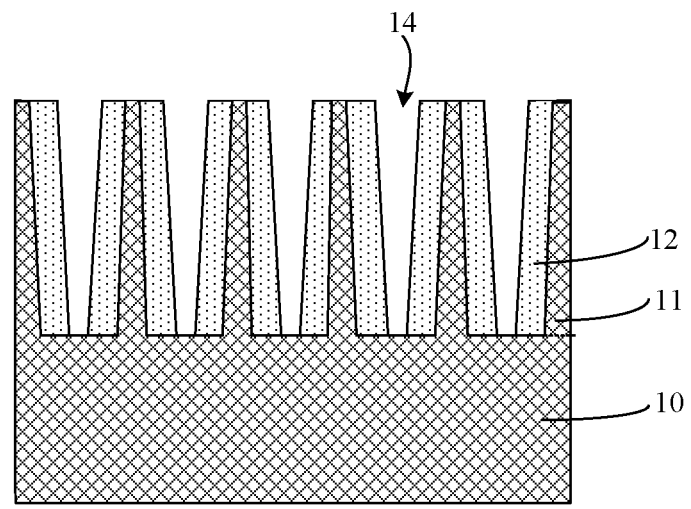
Figure 3:
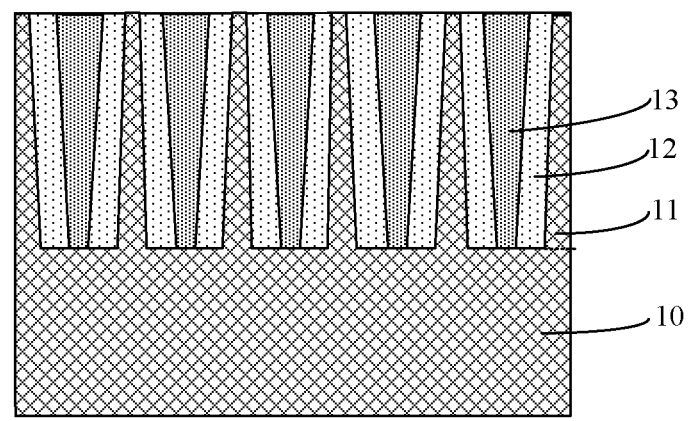

Based on analysis, it is found that one of reasons for the poorer continuity of the word lines is that the insulating layer between the word lines is wider at top and narrower the bottom. In some embodiments, FIGS. 1 to 4 are schematic diagrams of each step of a method for forming a semiconductor structure in the prior art. Referring to FIG. 1, a substrate 10 is provided with a plurality of semiconductor pillars 11 configured to form a transistor semiconductor channel. Generally, the semiconductor pillars 11 independent of one another are formed by means of an etching process. During the etching process, shapes of the semiconductor pillars 11 distant from a top of the substrate 10 are etched first. With the progress of the etching process, side walls of top ends of the semiconductor pillars 11 are subjected to more etching consumptions, such that the semiconductor pillars 11 formed are narrower at top and wider at bottom, and the width herein refers to a width in a direction parallel to a surface of the substrate 10. Referring to FIG. 2, after isolation layers 12 are formed on the semiconductor pillars 11 narrower at top and wider at bottom, grooves 14 between the isolation layers 12 are wider at top and narrower at bottom. Referring to FIG. 3, insulating layers 13 formed in the grooves 14 wider at top and narrower at bottom are wider at top and narrower at bottom.

Figure 4:
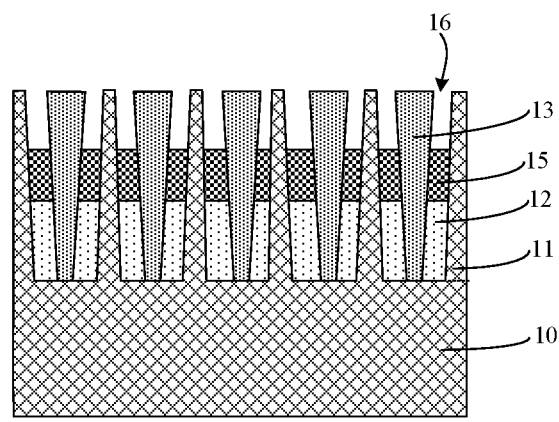

Referring to FIG. 4, after removing, by part of a height, the isolation layers 12 on the side walls of the semiconductor pillars 11, a groove 16 is formed between the semiconductor pillar 11 and the insulating layer 13, and the groove 16 is configured to fill a word line material to form word lines 15. The insulating layer 13 is wider at top and narrower at bottom, such that the groove 16 has a smaller top opening, and the smaller top opening increases difficulty of filling the word line material in the groove 16, and even causes a bottom of the groove 16 to fail to be filled up with the word line material, which may lead to poorer continuity of the word lines 15, or even breakage of the word lines 15.

To solve the above problems, embodiments of the present disclosure provide a semiconductor structure. The semiconductor pillars on the substrate are configured to form the semiconductor channel of the transistor, and the semiconductor pillars include a first doped region, a channel region and a second doped region sequentially arranged along a direction distant from the surface of the substrate. The semiconductor pillars in the channel region are configured to form a channel region in the semiconductor channel of the transistor, and the word lines extending along the first direction surround the semiconductor pillars in the channel region. A region between the insulating layer and the semiconductor pillar is configured to form mutually independent word lines. Therefore, compared to a case where an end of the insulating layer distant from the substrate has a larger width perpendicular to the first direction, the width of the insulating layer perpendicular to the first direction is gradually reduced along the direction distant from the surface of the substrate, such that the end of the insulating layer distant from the substrate has a smaller width perpendicular to the first direction, and the top of the region between the insulating layer and the semiconductor pillars has a larger opening, which is advantageous to avoiding poor continuity of the word lines filled in the groove, and avoiding breakage of the word lines. Moreover, compared to the insulating layer having a larger top width and a smaller bottom width, a structure of the insulating layer having a smaller top width and a larger bottom width is more stable, which may prevent a top end of the insulating layer from falling off due to the larger top width of the insulating layer.

The embodiments of the present disclosure will be described in detail below in conjunction with the accompanying drawings. However, a person of ordinary skill in the art may understand that in the embodiments of the present disclosure, many technical details are put forward such that a reader may better understand the present disclosure. However, the technical solutions requested to be protected by the embodiments of the present disclosure may also be implemented even without these technical details or various variations and modifications based on the following embodiments.

Figure 5:
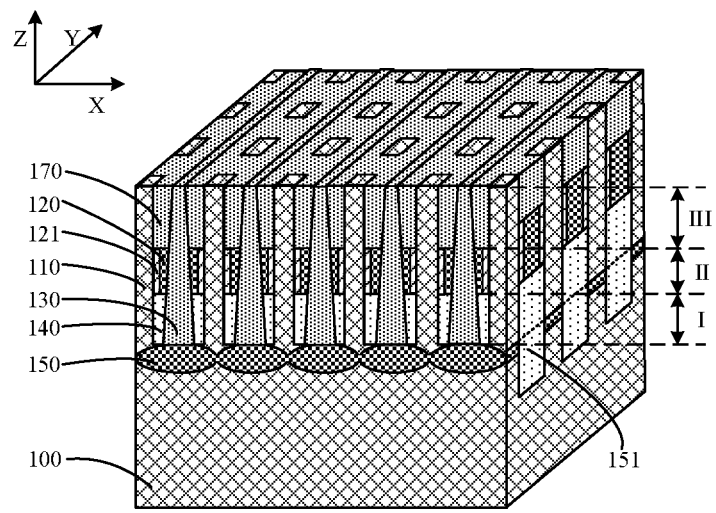
FIG. 5 is a schematic diagram of a semiconductor structure provided by an embodiment of the present disclosure.
Figure 6:
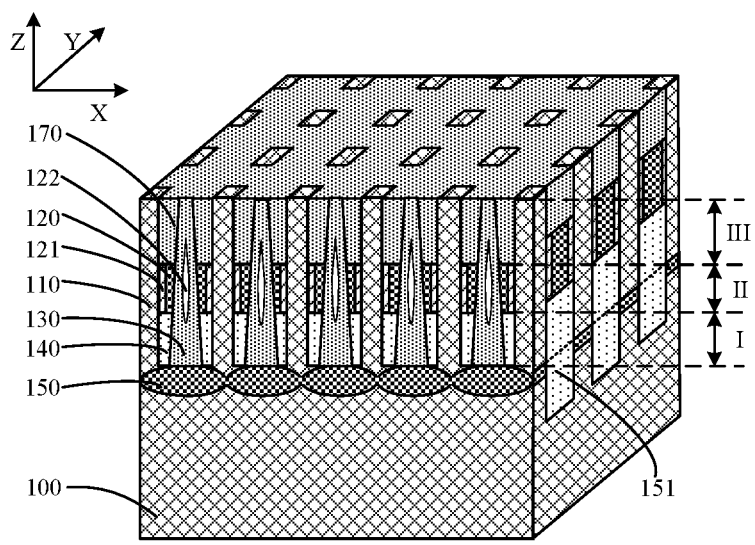
FIG. 6 is a schematic diagram of another semiconductor structure provided by an embodiment of the present disclosure.

FIG. 5 is a schematic diagram of a semiconductor structure provided by an embodiment of the present disclosure; FIG. 6 is a schematic diagram of another semiconductor structure provided by an embodiment of the present disclosure; and FIG. 7 is a schematic diagram of yet another semiconductor structure provided by an embodiment of the present disclosure.

Figure 7:
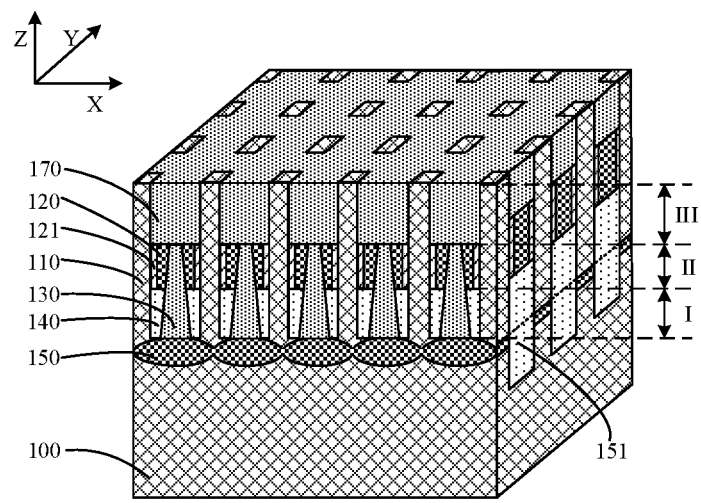
FIG. 7 is a schematic diagram of yet another semiconductor structure provided by an embodiment of the present disclosure.

Referring to FIG. 5, FIG. 6 or FIG. 7, the semiconductor structure includes: a substrate 100, where the substrate 100 is provided with a plurality of semiconductor pillars 110 arranged at intervals, and the plurality of semiconductor pillars 110 include a first doped region I, a channel region II and a second doped region III sequentially arranged along a direction distant from a surface of the substrate 100; and a plurality of word lines 120 extending along a first direction Y and an insulating layer 130 between adjacent word lines 120, where each of the word lines 120 surrounds the channel region II of the plurality of semiconductor pillars 110 arranged along the first direction Y, and along the direction distant from the surface of the substrate 100, a width of the insulating layer 130 perpendicular to the first direction Y gradually decreases.

A material of the substrate 100 is a semiconductor material, and in some embodiments, the material of the substrate 100 is silicon. In some other embodiments, the substrate 100 may be a germanium substrate, a silicon germanium substrate, a silicon carbide substrate, or a silicon-on-insulator substrate.

The semiconductor pillar 110 is a semiconductor channel of a transistor. In some embodiments, the transistor may be a gate-all-around (GAA) transistor, and the GAA transistor may obtain the smallest pattern size under given process conditions, which is advantageous to increasing integration density of the semiconductor structure. In addition, the material of the semiconductor pillar 110 may be the same as that of the substrate 100. In some embodiments, the material of the semiconductor pillar 110 may be silicon.

The direction distant from the surface of the substrate 100 is an extension direction of the semiconductor pillar 110, that is, a third direction Z. In the first doped region I, the channel region II and the second doped region III sequentially arranged along the third direction Z of the semiconductor pillar 110, the first doped region I and the second doped region III are configured to form a source and a drain of the transistor, and the channel region II of the semiconductor pillar 110 is configured to form a channel region of the transistor. The first doped region I and the second doped region III are doped regions, and in some embodiments, types of doping ions in the doped regions may be different from types of doping ions in the channel region II. In some embodiments, in one example, the doping ions in the doped regions may be N-type ions, and the doping ions in the channel region II may be P-type ions, where the P-type ions may be at least one of boron ions, indium ions or gallium ions, and the N-type ions may be at least one of arsenic ions, phosphorus ions or antimony ions. In another example, the doping ions in the doped regions may be the P-type ions, and the doping ions in the channel region II may be the N-type ions. In some other embodiments, the types of the doping ions in the doped regions may be the same as the types of the doping ions in the channel region II. That is, the semiconductor pillar 110 may be configured to form a junctionless field effect transistor.

In addition, an arrangement manner of the semiconductor pillars 110 may be an array arrangement, an arrangement direction of columns in the semiconductor pillars 110 is the first direction Y, and an arrangement direction of rows in the semiconductor pillars 110 is the second direction X, where the first direction Y is different from the second direction X. It should be noted that definitions of "row" and "column" are relative. That is, the arrangement direction of the rows may be defined as the first direction Y, and the arrangement direction of the columns may be defined as the second direction X.

The word lines 120 extend along the first direction Y and surround the semiconductor pillars 110 in the channel region II. In some embodiments, each of the word lines 120 may surround a column of semiconductor pillars 110 arranged along the first direction Y. As a gate of the transistor, the word line 120 is configured to turn on the channel region II based on a control signal, to implement transmission of carriers between the source and the drain. A material of the word lines 120 is a conductive material. In some examples, the material of the word lines 120 includes at least one of polycrystalline silicon, tungsten, molybdenum, titanium, cobalt, or ruthenium.

The insulating layer 130 extending along the first direction Y is configured to isolate the adjacent word lines 120. Moreover, a region between the insulating layer 130 directly facing to the channel region II of the semiconductor pillars 110 and the adjacent semiconductor pillars 110 in the channel region II is configured to form the word lines 120. Under the condition that the pitch between the adjacent semiconductor pillars 110 perpendicular to the first direction Y is constant, the wider the top end of the insulating layer 130 distant from the surface of the substrate 100 perpendicular to the first direction Y is, the smaller the pitch between the top end of the insulating layer 130 and the semiconductor pillars 110 perpendicular to the first direction Y is. The size of the pitch between the top end of the insulating layer 130 and the semiconductor pillars 110 perpendicular to the first direction Y determines the size of the opening for filling the word lines 120. Therefore, along the direction distant from the surface of the substrate 100, the width of the insulating layer 130 perpendicular to the first direction Y is gradually reduced. In one aspect, the top end of the insulating layer 130 has a smaller width perpendicular to the first direction Y, thereby increasing the pitch between the top end of the insulating layer 130 and the semiconductor pillars 110 perpendicular to the first direction Y, i.e., increasing the opening for filling the word lines 120, which is advantageous to reducing difficulty of forming the word lines 120, enlarging a process window for forming the word lines 120, and avoiding discontinuity or even breakage of the word lines 120 caused by the smaller opening for filling the word lines 120. In another aspect, compared to the insulating layer 130 having a larger top width and a smaller bottom width perpendicular to the first direction Y, a structure of the insulating layer 130 having a smaller top width and a larger bottom width is more stable, which may prevent the top end of the insulating layer 130 from falling off due to the larger top width of the insulating layer 130, such that it is advantageous to preventing the insulating layer 130 from falling into the filling region of the word lines 120 before or during the formation of the word lines 120, and thus it is avoidable destroying the structure of the word lines 120 or adversely affecting electrical conductivity of the word lines 120.

In some embodiments, a material of the insulating layer 130 may be a silicon nitride material having a greater hardness and better support. In some other embodiments, the material of the insulating layer 130 may be other insulating materials, such as silicon oxynitride or a high-K dielectric material.

In some embodiments, the width of the top surface of the insulating layer 130 perpendicular to the first direction Y may be 10 to 20 nm, for example, 12 nm, 14 nm, 16 nm, 17 nm, and 19 nm. The width of the bottom surface of the insulating layer 130 perpendicular to the first direction Y may be 15 to 30 nm, for example, 17 nm, 18 nm, 20 nm, 23 nm, and 25 nm.

When the width of the top surface of the insulating layer 130 perpendicular to the first direction Y is too small, this may cause the top end of the insulating layer 130 to fail to produce a good isolation effect. When the width of the top surface of the insulating layer 130 perpendicular to the first direction Y is too large, this may reduce the pitch between the top end of the insulating layer 130 and the semiconductor pillars 110 directly facing thereto, thereby reducing the filling opening of the word lines 120. In addition, the width of the bottom surface of the insulating layer 130 perpendicular to the first direction Y is too large, which may increase the size of the semiconductor structure perpendicular to the first direction Y. When the width of the bottom surface of the insulating layer 130 perpendicular to the first direction Y is too small, the structure of the insulating layer 130 is not stable enough. Therefore, the width of the top surface of the insulating layer 130 perpendicular to the first direction Y is set to 10 to 20 nm, and the width of the bottom surface of the insulating layer 130 perpendicular to the first direction Y is set to 15 to 30 nm. Based on such settings, in one aspect, it is advantageous to ensuring a larger filling opening of the word lines 120; and in another aspect, it is not only advantageous to reducing the size of the semiconductor structure perpendicular to the first direction Y, but also advantageous to ensuring that the insulating layer 130 has a more stable structure, which may prevent the top end of the insulating layer 130 from falling off due to the larger top width, such that it is advantageous to preventing the insulating layer 130 from falling into the filling region of the word lines 120 before or during the formation of the word lines 120, and thus it is avoidable destroying the structure of the word lines 120 or adversely affecting the electrical conductivity of the word lines 120.

In some embodiments, the semiconductor structure further includes a plurality of dielectric layers 140 extending along the first direction Y, the dielectric layers 140 surround the first doped region I of the plurality of semiconductor pillars 110 arranged along the first direction Y, the word lines 120 are positioned on the top surfaces of the dielectric layers 140, and the insulating layer 130 is also positioned between the adjacent dielectric layers 140. The dielectric layers 140 are configured to provide support to the word lines 120 arranged around the semiconductor pillars 110 in the channel region II, and the pitch between the adjacent dielectric layers 140 defines the shape of part of the insulating layer 130 and the position of the insulating layer 130, which is advantageous to forming the insulating layer 130 using the dielectric layers 140, and reducing difficulty of fabrication of the insulating layer 130.

In some embodiments, a material of the dielectric layers 140 is silicon oxide, and the fabrication process of the silicon oxide is mature, which is advantageous to reducing the difficulty of fabrication of the dielectric layers 140. In some other embodiments, the material of the dielectric layers 140 may also be other insulating materials, such as silicon oxynitride, silicon nitride or a high-K dielectric material.

In some embodiments, referring to FIG. 6, the insulating layer 130 is internally provided with air gaps 122. In some embodiments, because the width, perpendicular to the first direction Y, of the groove for assisting the formation of the insulating layer 130 is gradually reduced, the insulating layer 130 formed has a structure narrower at top and wider at bottom. Therefore, the smaller opening at the top of the groove may affect the filling process for forming the insulating layer 130, such that the insulating layer 130 formed is internally provided with the air gaps. Providing the air gaps in the insulating layer 130 is advantageous to reducing a parasitic capacitance between the adjacent word lines 120 in contact with the insulating layer 130, which is advantageous to improving the electrical properties of the semiconductor structure.

In some embodiments, referring to FIG. 5, FIG. 6 or FIG. 7, the semiconductor structure further includes a gate dielectric layer 121, where the gate dielectric layer 121 surrounds the side surface of the semiconductor pillar 110 in the channel region II, and is positioned between the word line 120 and the semiconductor pillar 110.

The gate dielectric layer 121 is configured to implement, by means of the word lines 120, conduction between the source of the transistor and the drain of the transistor. In some embodiments, a material of the gate dielectric layer 121 may be silicon oxide, and the process for forming silicon oxide, by means of a thermal oxygen process, on the semiconductor pillars 110 made of silicon is mature, which is advantageous to reducing the difficulty of fabrication of the gate dielectric layer 121. In some other embodiments, the material of the gate dielectric layer 121 may also be silicon nitride or silicon oxynitride.

In some embodiments, referring to FIG. 5, FIG. 6 or FIG. 7, the semiconductor structure further includes: a plurality of bit lines 150 extending along the second direction X, where each of the plurality of bit lines 150 is positioned between the plurality of semiconductor pillars 110 arranged along the second direction X and the substrate 100, and the plurality of bit lines 150 are electrically connected to the first doped region I; and an isolation layer 151 positioned between adjacent bit lines 150.

The bit lines 150 are configured to lead out the source or drain of the transistor and provide an electric signal to the source or drain of the transistor, and the isolation layers 151 are configured to implement isolation between the adjacent bit lines 150. The bit lines 150 may be in contact with bottoms of a row of semiconductor pillars 110 arranged along the second direction X, and the material of the bit lines 150 may be a conductive material. In some embodiments, the material of the bit lines 150 includes metal silicides, and the metal silicides are buried bit lines 150 formed by means of a silicon metallization process. In some other embodiments, the material of the bit lines 150 may also include metal silicides and metals. The material of the isolation layers 151 is an insulating material. In some embodiments, the material of the isolation layers 151 may be at least one of silicon oxide or silicon nitride.

Referring to FIG. 5, FIG. 6 or FIG. 7, in some embodiments, the semiconductor structure further includes: a word line capping layer 170 configured to cap the top surface of the word line 120. The word line capping layer 170 is configured to protect the word lines 120, which is advantageous to preventing the word lines 120 from being damaged by impurities in subsequent processes, and is advantageous to preventing the word lines 120 from being damaged in the subsequent processes. In addition, the word line capping layer 170 also provides support to a structure subsequently formed on the word lines 120, which is advantageous to improving the stability of the semiconductor structure.

In some embodiments, a material of the word line capping layer 170 is silicon nitride, which has a better barrier effect on impurity ions or water vapor, and thus it is advantageous to achieving a better protection effect on the word lines 120. In some other embodiments, the word line capping layer 170 may also be made of other insulating materials having a barrier effect, such as silicon oxynitride.

Referring to FIG. 7, in some embodiments, the top surface of the insulating layer 130 is lower than that of the word line capping layer 170, and the word line capping layer 170 is also positioned on the top surface of the insulating layer 130. In some embodiments, the top surface of the insulating layer 130 may be flush with the top surfaces of the word lines 120, and the insulating layer 130 flush with the top surfaces of the word lines 120 enables a word line material to reach word line filling regions on the side walls of the semiconductor pillars 110 in the channel region II without passing through a deeper groove, which is advantageous to reducing difficulty of filling the word lines 120. In addition, when the word line capping layer 170 is only positioned on the top surfaces of the word lines 120, there is a height difference between the top surface of the insulating layer 130 and the top surfaces of the word lines 120, and the height difference may adversely affect the stability of the semiconductor structure formed subsequently. Therefore, the word line capping layer 170 positioned on the top surface of the insulating layer 130 is advantageous to forming a flat top surface to provide support for the semiconductor structure subsequently formed on the insulating layer 130, thereby improving the stability of the semiconductor structure.

Referring to FIG. 5 or FIG. 6, in some embodiments, the top surface of the insulating layer 130 is flush with the top surface of the word line capping layer 170. That is, the word line capping layer 170 is only positioned on the top surfaces of the word lines 120, such that the top surface of the insulating layer 130 is flush with the top surface of the word line capping layer 170, which is advantageous to avoiding presence of the height difference on the top surface of the semiconductor structure, and is advantageous to preventing the height difference from adversely affecting the stability of the structure formed subsequently.

In the technical solutions provided by the above embodiments, the semiconductor pillar 110 on the substrate 100 is configured to form the semiconductor channel of the transistor. The semiconductor pillars 110 include a first doped region I, a channel region II and a second doped region III sequentially arranged along a direction distant from a surface of the substrate 100, where the semiconductor pillars 110 in the channel region II are configured to form a channel region in the semiconductor channel of the transistor, and the word lines 120 extending along the first direction Y surround the semiconductor pillars 110 in the channel region II. A region between the insulating layer 130 directly facing to the channel region II of the semiconductor pillars 110 and the adjacent semiconductor pillars 110 in the channel region II is configured to form the word lines 120. Under the condition that the pitch between the adjacent semiconductor pillars 110 perpendicular to the first direction Y is constant, the wider the top end of the insulating layer 130 distant from the surface of the substrate 100 perpendicular to the first direction Y is, the smaller the pitch between the top end of the insulating layer 130 and the semiconductor pillars 110 perpendicular to the first direction Y is. The size of the pitch between the top end of the insulating layer 130 and the semiconductor pillars 110 perpendicular to the first direction Y determines the size of the opening for filling the word lines 120. Therefore, along the direction distant from the surface of the substrate 100, the width of the insulating layer 130 perpendicular to the first direction Y is gradually reduced. In one aspect, the top end of the insulating layer 130 has a smaller width perpendicular to the first direction Y, thereby increasing the pitch between the top end of the insulating layer 130 and the semiconductor pillars 110 perpendicular to the first direction Y, i.e., increasing the opening for filling the word lines 120, which is advantageous to reducing difficulty of forming the word lines 120, enlarging a process window for forming the word lines 120, and avoiding discontinuity or even breakage of the word lines 120 caused by the smaller opening for filling the word lines 120. In another aspect, compared to the insulating layer 130 having a larger top width and a smaller bottom width perpendicular to the first direction Y, the structure of the insulating layer 130 having a smaller top width and a larger bottom width is more stable, which may prevent the top end of the insulating layer 130 from falling off due to the larger top width of the insulating layer 130, such that it is advantageous to preventing the insulating layer 130 from falling into the filling region of the word lines 120 before or during the formation of the word lines 120, and thus it is avoidable destroying the structure of the word lines 120 or adversely affecting electrical conductivity of the word lines 120.

Another aspect of the embodiments of the present disclosure further provides a method for forming a semiconductor structure, to form the semiconductor structure described in the above embodiments. The method for forming the semiconductor structure provided by the embodiments of the present disclosure will be described in detail below with reference to the accompanying drawings. It should be noted that reference may be made to the detailed description of the foregoing embodiment for the same or corresponding parts as the previous embodiment, which is not described again herein.

FIGS. 8 to 25 are schematic diagrams of steps of a method for forming the semiconductor structure according to embodiments of the present disclosure. It should be noted that, in FIG. 8 to FIG. 25, FIG. 9 is a sectional view of the semiconductor structure shown in FIG. 8 including semiconductor pillars along the third direction Z; FIGS. 10 to 13, FIGS. 16 to 22 and FIG. 24 to FIG. 25 are sectional views at C-Cl shown in FIG. 9; and FIG. 23 is a vertical view of the semiconductor structure shown in FIG. 22.

Figure 8:
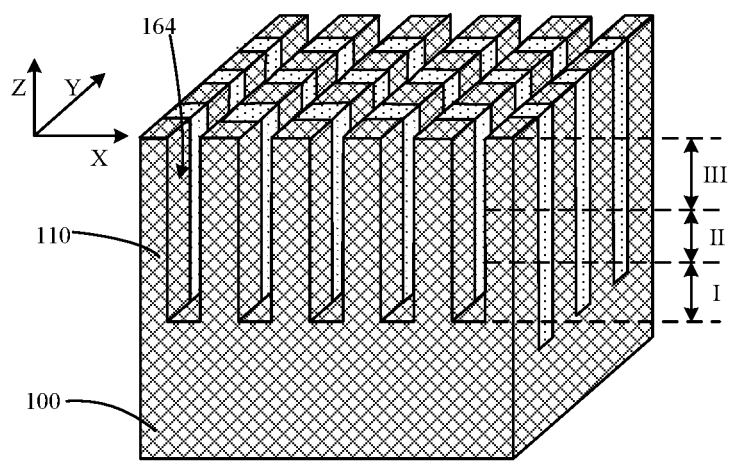
FIGS. 8 to 25 are schematic diagrams of steps of a method for forming the semiconductor structure according to embodiments of the present disclosure.
Figure 9:
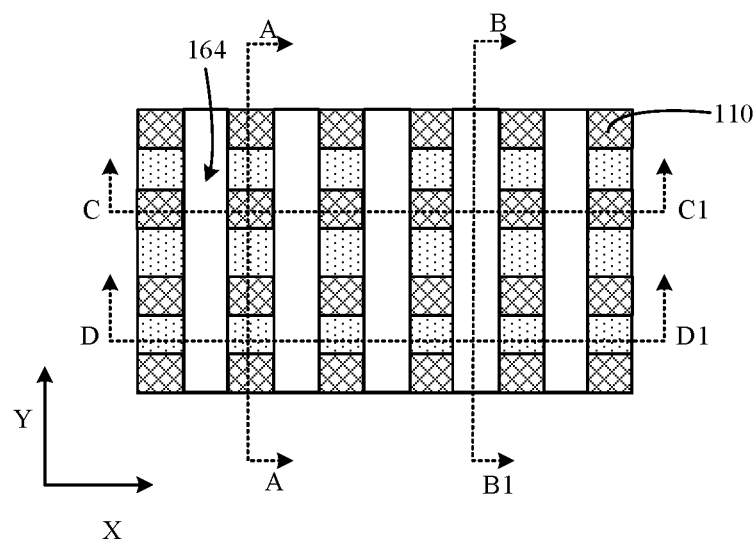

Referring to FIG. 8, the method for forming the semiconductor structure includes: providing a substrate 100, where the substrate 100 has a plurality of semiconductor pillars 110 arranged at intervals, and the semiconductor pillars 110 include a first doped region I, a channel region II and a second doped region III sequentially arranged along a direction distant from a surface of the substrate 100.

In some embodiments, the providing the substrate may include providing an initial substrate, patterning the initial substrate, and forming a plurality of grooves extending along the second direction X. An isolation material is filled in the groove, and the isolation material may be silicon oxide. A stacked mask layer (not shown) is formed on the initial substrate with the isolation material, where the stacked mask layer may include an initial mask layer, a carbon mask layer, a first silicon oxynitride mask layer, a spin-on hard mask layer, and a second silicon oxynitride mask layer, which are sequentially stacked and arranged along the third direction Z. The stacked mask layer is etched to form the initial mask layer with etching windows. The initial substrate with the isolation material is patterned using the initial mask layer as a mask to form the plurality of grooves extending along the first direction Y and the plurality of semiconductor pillars 110 arranged at intervals, and the initial mask layer on the tops of the semiconductor pillars is removed. The isolation material between adjacent semiconductor pillars 110 may be used as a first dielectric film subsequently. The method of forming the semiconductor pillars 110 by patterning the initial substrate is advantageous to simplifying technological processes and saving fabrication costs.

In some embodiments, the initial substrate may be patterned by means of a self-aligned double patterning (SADP) process or a self-aligned quadruple patterning (SAQP) process. The SADP process or the SAQP process can form a smaller-sized pattern, which is advantageous to improving fineness of the process of patterning the initial substrate, to forming the smaller-sized semiconductor pillar 110, and to reducing the size of the semiconductor structure.

In some embodiments, after the semiconductor pillar 110 is formed, a doping process is further performed on the semiconductor pillars 110 to form the channel region II and the doped regions positioned on two sides of the channel region II. That is, the channel region II, the first doped region I and the second doped region are formed. The doped regions on two sides of the channel region II constitute the source and the drain of the semiconductor structure. In some embodiments, the semiconductor pillars 110 may be doped by means of any one of ion implantation or thermal diffusion. In some other embodiments, the initial substrate may also be doped before the semiconductor pillars 110 are formed, such that after the mutually independent semiconductor pillars 110 are formed, the semiconductor pillars 110 have the channel region II, the first doped region I, and the second doped region III.

Figure 10:
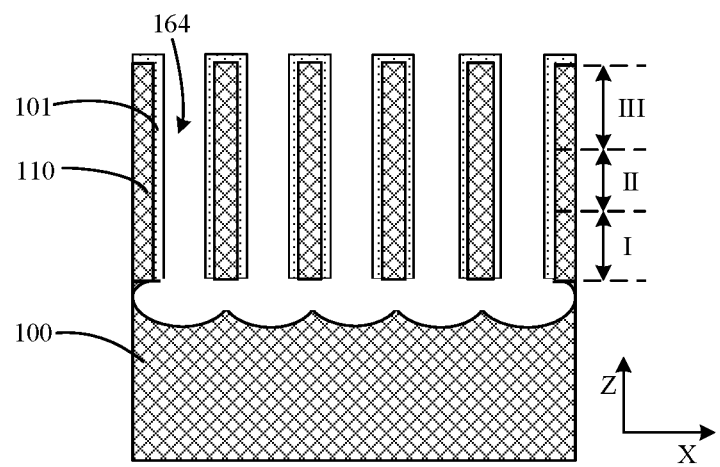
Figure 11:
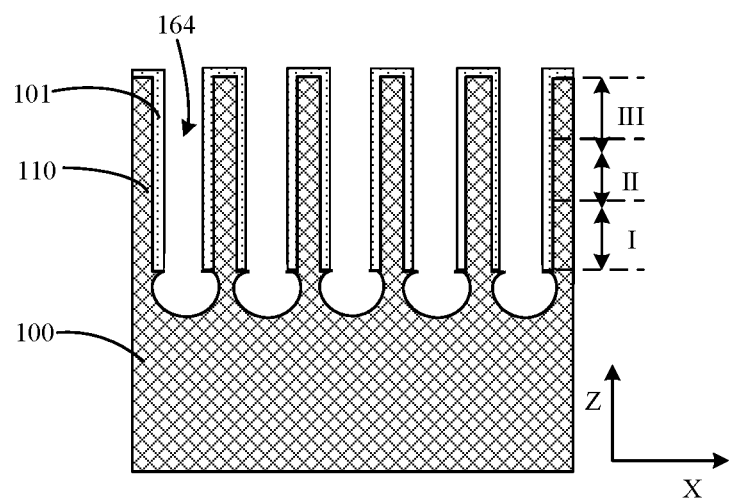

Referring to FIGS. 8 to 13, in some embodiments, before forming the word lines and the insulating layer, the method further includes: forming a plurality of bit lines 150 extending along the second direction X, where each of the plurality of bit lines 150 is positioned between the plurality of semiconductor pillars 110 arranged along the second direction X and the substrate 100, and the plurality of bit lines 150 are electrically connected to the first doped region I. In some embodiments, there are grooves 164 between the semiconductor pillars 110 shown in FIG. 8 and the insulating material between the adjacent semiconductor pillars 110 arranged along the first direction Y. The forming the plurality of bit lines includes: referring to FIG. 10 and FIG. 11, forming oxide layers 101 on the side walls and tops of the semiconductor pillars 110, where the oxide layers 101 are configured to protect the semiconductor pillars 110, which is advantageous to preventing from causing damage to the semiconductor pillars 110 when the bottoms of the grooves 164 are subsequently etched. In addition, the oxide layers 101 are also advantageous to preventing the subsequent metal silicide process for forming the bit lines from polluting the semiconductor pillars 110. Still referring to FIG. 10 and FIG. 11, after forming the oxide layers 101, the method further includes: etching the bottoms of the grooves 164 to further deepen the grooves 164, such that metal layers subsequently formed in the grooves 164 are in contact with more substrate 100, and the bit lines 150 in the grooves 164 are more easily connected to one another, which is advantageous to reducing the difficulty of fabrication of the bit lines 150, and is advantageous to avoiding poor contact between the bit lines 150. After the bottoms of the grooves 164 are etched, the bottoms of the grooves 164 may be shaped like bowls interconnected to one another as shown in FIG. 10. In some other embodiments, the bottoms of the grooves 164 may also be shaped like bowls as shown in FIG. 11 or may also be shaped like other irregular bowls.

In some embodiments, the metal layer may be formed by means of a physical vapor deposition process, and the material of the metal layer may be titanium, cobalt or nickel. In some other embodiments, the metal layer may also be formed by means of an atomic layer deposition process, and the material of the metal layer may be titanium nitride, molybdenum or tungsten. In some embodiments, metal films may be deposited first, and then etched back to remove the metal films on the tops and the side walls of the semiconductor pillars 110, and only the metal films at the bottoms of the grooves 164 are retained as the metal layers.

Figure 13:
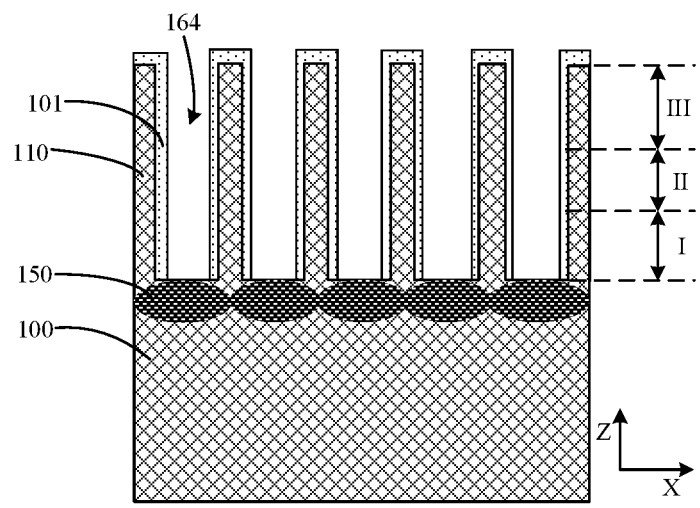

In some embodiments, when the bottoms of the grooves 164 are shaped like bowls interconnected to one another as shown in FIG. 10, after the metal layers are formed, referring to FIG. 13, the metal layers may be directly used as the bit lines 150. Therefore, the grooves 164 are deepened, such that interconnected structures formed at the bottoms of the grooves 164 are advantageous to reducing the difficulty of fabrication of the bit lines 150.

Figure 12:
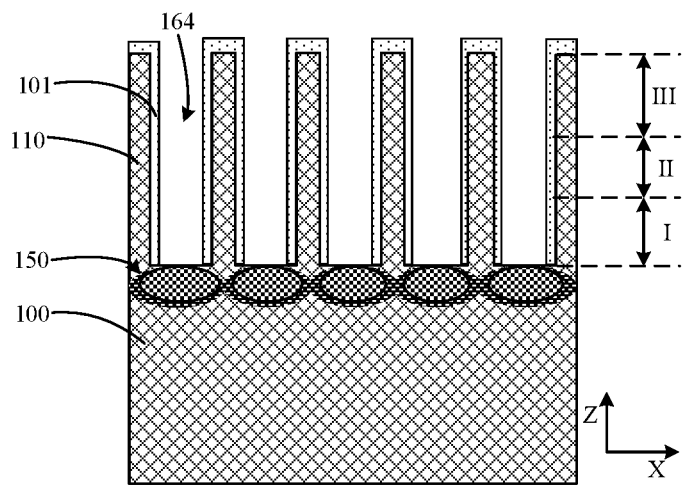

In some embodiments, when the bottoms of the grooves 164 are shaped like the bowls as shown in FIG. 11, after the metal layers are formed, the method further includes: annealing the metal layers in the grooves 164, and forming metal silicide layers at the bottoms of the grooves 164 and at the bottoms of the semiconductor pillars 110. Referring to FIG. 12, the metal silicide layers and the metal layers jointly constitute the bit lines 150.

Figure 14:
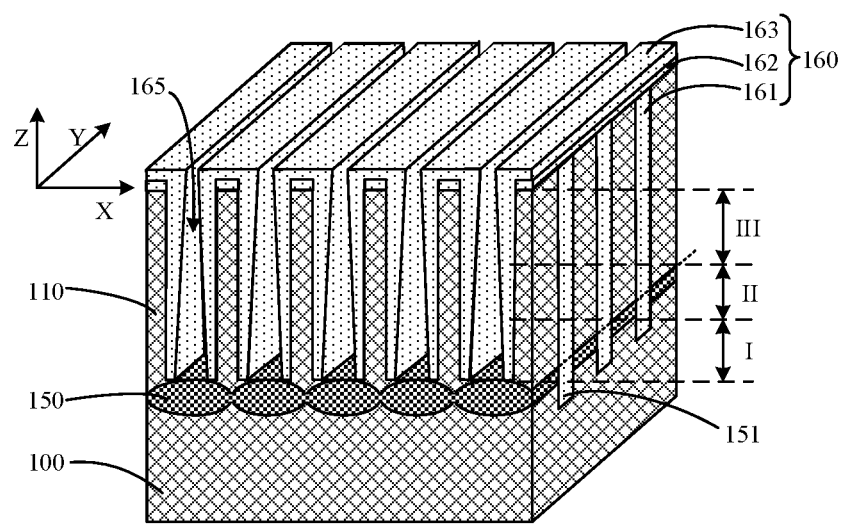

In some embodiments, referring to FIG. 14, after the forming the bit lines 150, the method includes: forming a plurality of dielectric films 160 extending along the first direction Y, where the plurality of dielectric films 160 are configured to cap the plurality of semiconductor pillars 110 arranged along the first direction Y and are configured to fill a region between adjacent semiconductor pillars 110 arranged along the first direction Y. Along the direction distant from the surface of the substrate 100, a pitch between adjacent dielectric films 160 perpendicular to the first direction Y gradually decreases. The grooves 165 between the adjacent dielectric films 160 are configured to form the subsequent insulating layer 130, and the pitch between the adjacent dielectric films 160 perpendicular to the first direction Y is gradually reduced. That is, along the direction distant from the surface of the substrate 100, the width of the insulating layer 130 formed between the adjacent dielectric films 160 perpendicular to the first direction Y is gradually reduced, which is advantageous to enlarging the opening for filling the word lines, to form the word lines with better continuity.

Referring to FIG. 14, in some embodiments, the dielectric films 160 include a first dielectric film 161, a second dielectric film 162, and a third dielectric film 163. The forming the plurality of dielectric films 160 includes: forming the first dielectric film 161 positioned between adjacent semiconductor pillars 110 arranged along the first direction Y; forming the second dielectric film 162 on top surfaces of the semiconductor pillars 110 and a top surface of the first dielectric film 161; and forming the third dielectric film 163 configured to cap the semiconductor pillars 110, the first dielectric film 161 and the second dielectric film 162. The material of the first dielectric film 161, the material of the second dielectric film 162 and the material of the third dielectric film 163 are the same. Therefore, after the second dielectric film 162 is formed, when the third dielectric film 163 is formed on the side wall of the second dielectric film 162, the third dielectric film 163 is easier to form on the side wall of the second dielectric film 162 made of the same material, which is advantageous to forming the dielectric film 160 with a larger top width perpendicular to the first direction Y.

In some embodiments, referring to FIG. 14, after the semiconductor pillars 110 are formed, the isolation material between the adjacent semiconductor pillars 110 may be used as the first dielectric film 161, the initial mask layer at the tops of the semiconductor pillars 110 may be retained as the second dielectric film 162, the initial third dielectric film is deposited on the entire surface of the semiconductor structure, and the initial third dielectric film on the substrate 100 at the bottoms of the grooves is removed by etching-back to form the third dielectric film 163 shown in FIG. 14.

In some embodiments, the deposition process for forming the initial third dielectric film may be a chemical vapor deposition process or an atomic layer deposition process, and the deposition rate may be increased by adjusting the process parameters of the deposition process, thereby forming the dielectric film 160 with a larger top width and a smaller bottom width perpendicular to the first direction Y.

Figure 15:
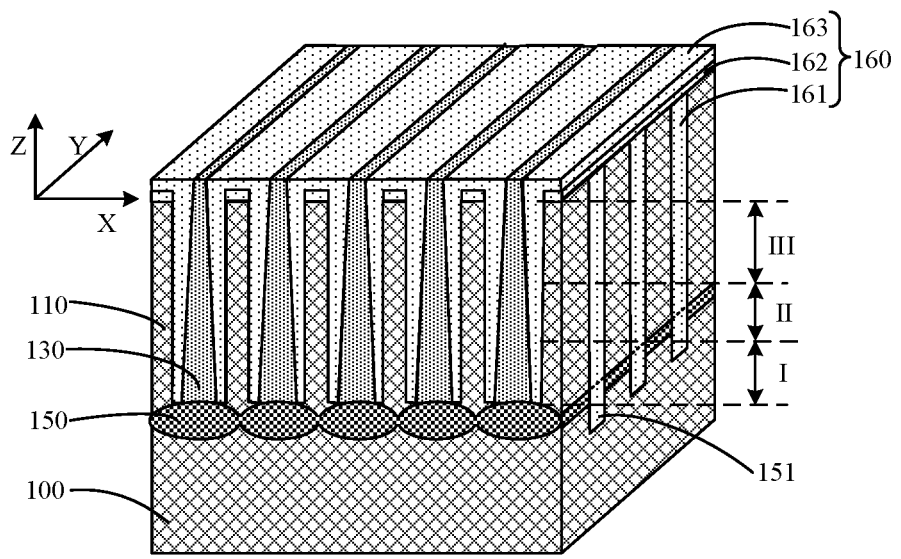
Figure 16:
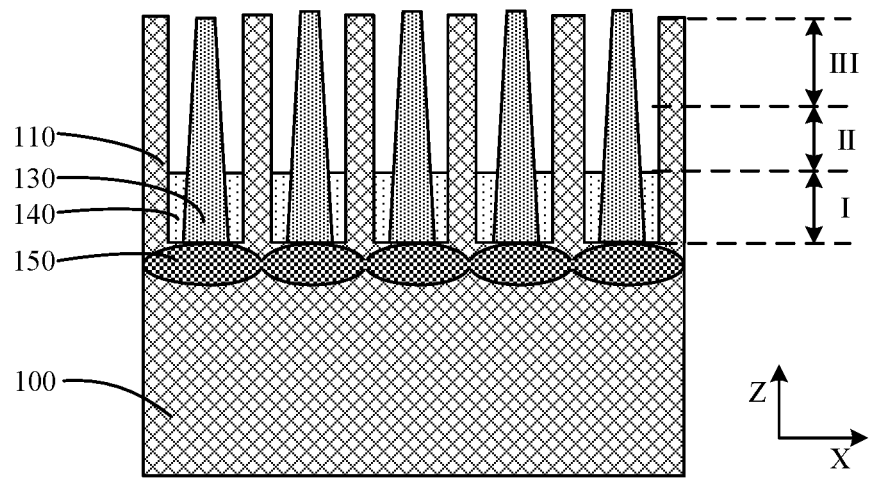
Figure 17:
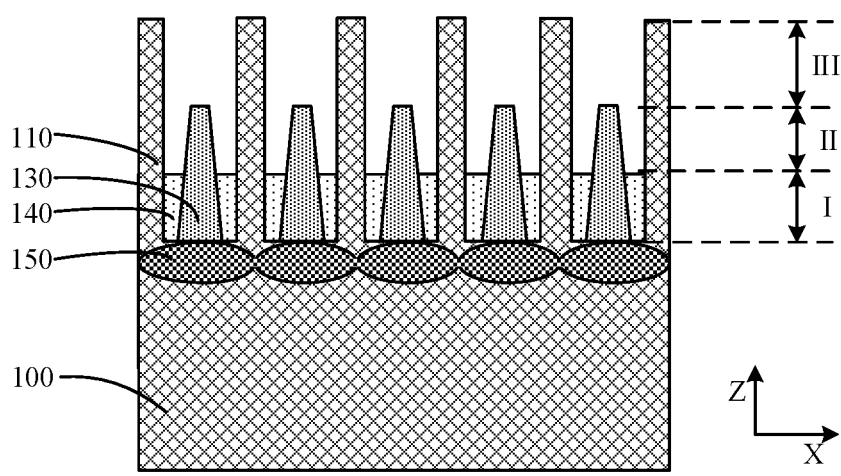

Referring to FIGS. 15 to 17, a plurality of word lines 120 extending along the first direction Y and an insulating layer 130 between adjacent word lines 120 are formed, where each of the word lines 120 surrounds the channel region II of the plurality of semiconductor pillars 110 arranged along the first direction Y, and along the direction distant from the surface of the substrate 100, a width of the insulating layer 130 perpendicular to the first direction Y gradually decreases. The insulating layer 130 with a gradually reduced width may increase the pitch between the top end of the insulating layer 130 and the semiconductor pillars 110 directly facing thereto perpendicular to the first direction Y, which is advantageous to enlarging the opening for filling the word lines 120, reducing the difficulty of formation of the word lines 120 and enlarging the process window for forming the word lines 120, and avoiding the discontinuity or even breakage of the word lines 120 caused by the smaller opening for filling the word lines 120. Moreover, perpendicular to the first direction Y, the structure of the insulating layer 130 having a smaller top width and a larger bottom width is more stable, which may prevent the top end of the insulating layer 130 from falling off due to the larger top width of the insulating layer 130, such that it is advantageous to preventing the insulating layer 130 from falling into the filling region of the word lines 120 before or during the formation of the word lines 120, and thus it is avoidable destroying the structure of the word lines 120 or adversely affecting electrical conductivity of the word lines 120.

Referring to FIG. 15, in some embodiments, the insulating layer 130 is formed between the adjacent dielectric films 160. The pitch between the adjacent dielectric films 160 perpendicular to the first direction Y is gradually reduced, such that the width of the insulating layer 130 formed between the adjacent dielectric films 160 perpendicular to the first direction Y is gradually reduced. In some embodiments, the insulating layer 130 may be formed by means of the chemical vapor deposition process, and the material of the insulating layer 130 may be silicon nitride.

Referring to FIG. 16, the dielectric films on the side surfaces of the semiconductor pillars 110 in the channel region II are etched and removed to expose the semiconductor pillars 110 in the channel region II. The dielectric films on the side walls of the semiconductor pillars 110 in the first doped region I are retained as the dielectric layers 140, to protect the semiconductor pillars 110 in the first doped region I and provide support for the subsequently formed word lines arranged around the semiconductor pillars 110 in the channel region II.

Referring to FIG. 17, in some embodiments, when etching to remove the dielectric films, the method further includes: removing the insulating layer 130 directly facing to the side surfaces of the semiconductor pillars 110 in the second doped region III. The top surface of the insulating layer 130 is flush with the top surfaces of the semiconductor pillars 110 in the channel region II. The insulating layer 130 flush with the top surfaces of the semiconductor pillars 110 in the channel region II enables the word line material to reach the word line filling regions on the side walls of the semiconductor pillars 110 in the channel region II without passing through a deeper groove, which is advantageous to reducing the difficulty of filling the word lines subsequently. In some embodiments, the insulating layer 130 and the dielectric film on the side walls of the semiconductor pillars 110 in the second doped region III may be directly removed by means of an etching process, and then the dielectric film on the side walls of the semiconductor pillars 110 in the channel region II is removed by means of an etching process with a relatively high etching selection ratio to the dielectric film, to form the semiconductor structure shown in FIG. 17.

Figure 18:
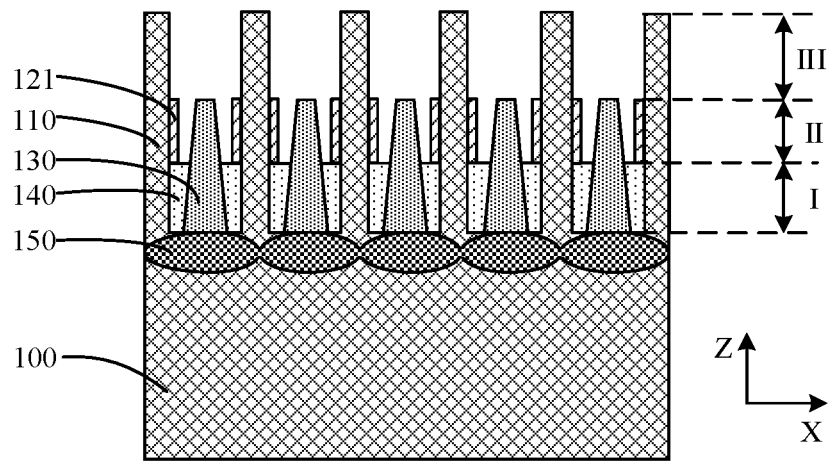

Referring to FIG. 18, in some embodiments, before forming the word line, the method further includes: forming a gate dielectric layer 121, where the gate dielectric layer 121 surrounds side surfaces of the semiconductor pillars 110 in the channel region II and is positioned between the word lines and the semiconductor pillars 110. In some embodiments, the semiconductor pillars 110 may be directly oxidized by means of a thermal oxidation process. That is, the gate dielectric layer 121 may be formed on the side surfaces of the semiconductor pillars 110 in the channel region II, which is advantageous to reducing the difficulty of fabrication of the gate dielectric layer 121.

It can be understood that, in some embodiments, the gate oxide layers are also formed on the side surfaces and top surfaces of the semiconductor pillars 110 in the second doped region III.

Figure 19:
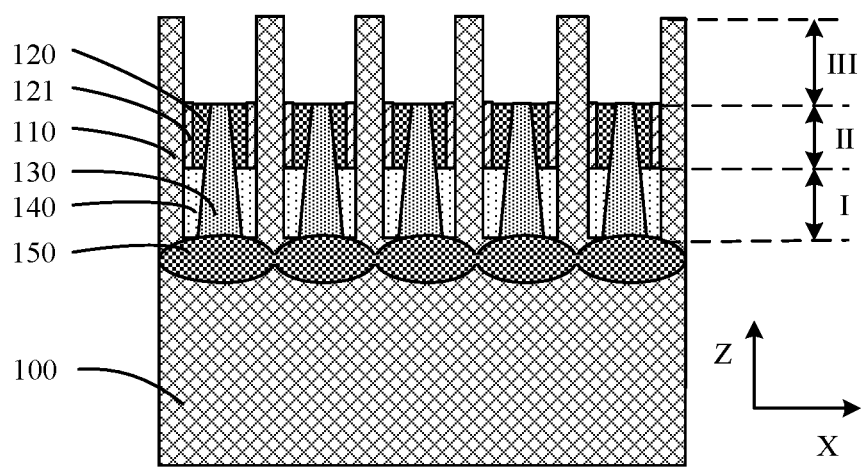

Referring to FIG. 19, the word lines 120 are formed on the top surface of the remaining part of the dielectric film and in the region between the side surfaces of the semiconductor pillars 110 in the channel region II and the insulating layer 130 directly facing thereto. In some embodiments, the conductive material may be deposited on the entire surface by means of the physical vapor deposition process, and then the conductive material is removed by etching-back by part of the thickness, to form the word lines 120 surrounding the semiconductor pillars 110 in the channel region II. Since the top end of the insulating layer 130 has a small width perpendicular to the first direction, the continuity of the word lines 120 surrounding the semiconductor pillars 110 in the channel region II is better, and the word lines 120 with better continuity facilitate improving the electrical properties of the semiconductor structure.

Figure 20:
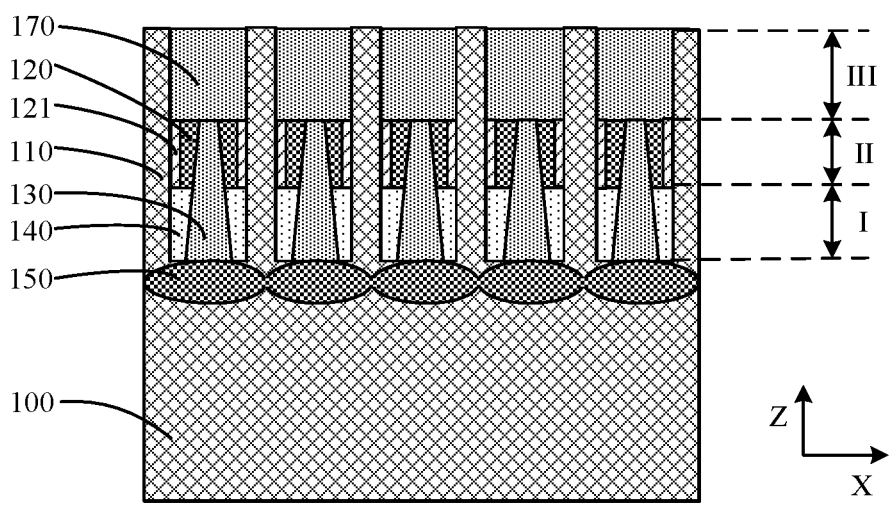

Referring to FIG. 20, in some embodiments, after forming the word lines 120, the method further includes: forming a word line capping layer 170 on top surfaces of the word lines 120 and a top surface of the insulating layer 130. The word line capping layer 170 is configured to protect the word lines 120, which is advantageous to preventing the word lines 120 from being damaged by impurities in subsequent processes, and is advantageous to preventing the word lines 120 from being damaged in the subsequent processes.

In some embodiments, the word line capping layer 170 may be formed by means of a chemical vapor deposition process. A material of the word line capping layer 170 may be silicon nitride, and the silicon nitride has a better barrier effect on impurity ions or water vapor, which is advantageous to achieving a better protection effect on the word lines 120.

The embodiments of the present disclosure also provide a method for forming the word lines 120, which is different from the method in the above embodiment, and the details are as follows.

Figure 21:
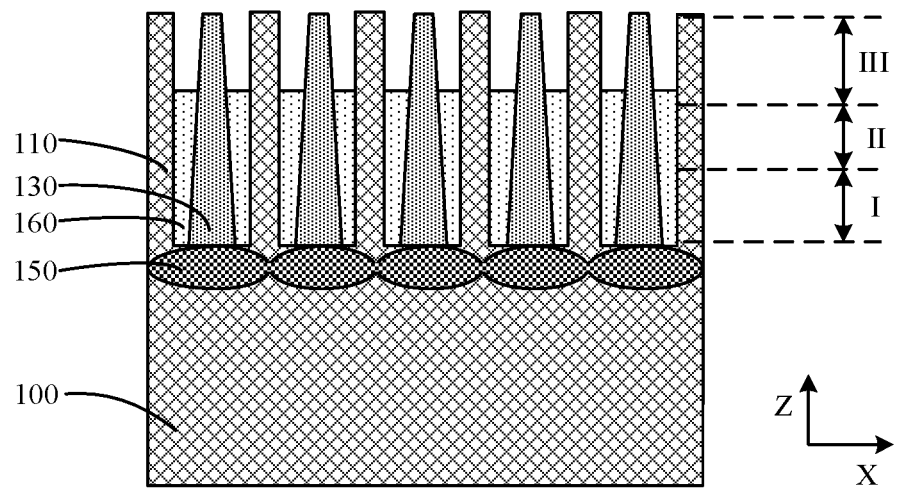
Figure 22:
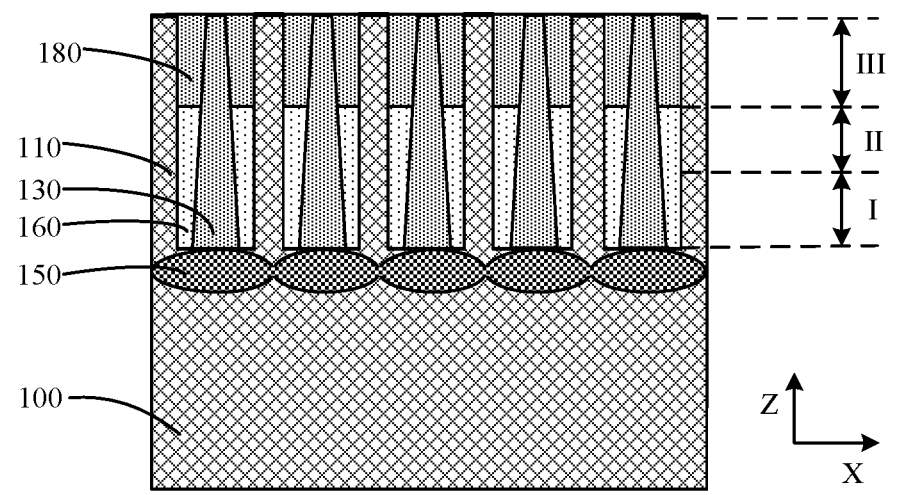
Figure 23:
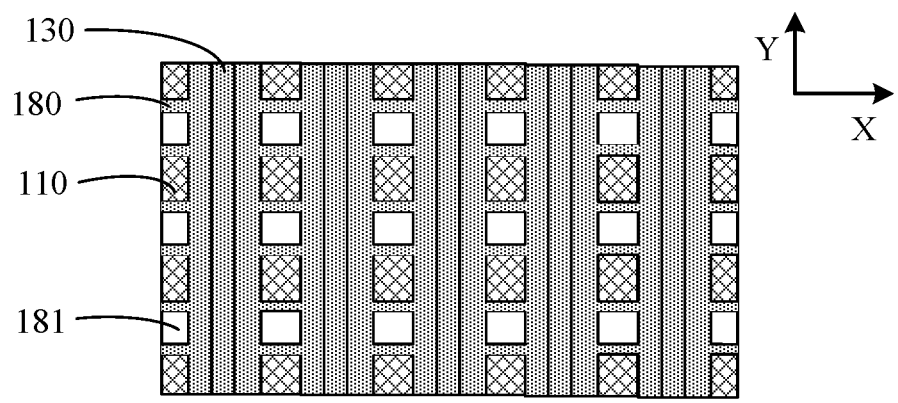
Figure 24:
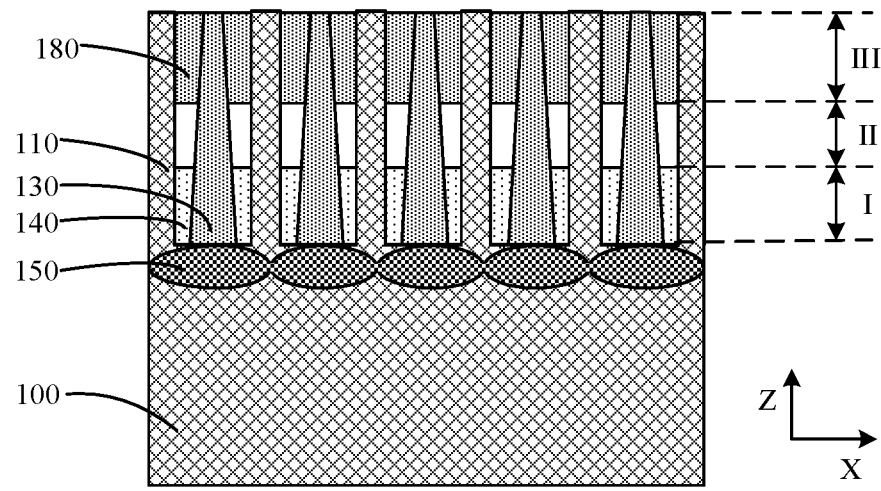

Referring to FIGS. 21 to 25, in some embodiments, before etching to remove the dielectric films 160 on the side surfaces of the semiconductor pillars 110 in the channel region II, the method further includes: referring to FIG. 21, etching to remove the dielectric films 160 on the side surfaces of the semiconductor pillars 110 in the second doped region III; referring to FIG. 22 and FIG. 23, forming an insulating film 180 in a region between the side surfaces of the semiconductor pillars 110 in the second doped region III and the insulating layer 130 directly facing thereto, where the insulating film 180 has an etching window 181 exposing the dielectric films 160; and referring to FIG. 24, removing the dielectric films 160 on the side surfaces of the semiconductor pillars 110 in the channel region II by means of the etching window 181. In this way, the remaining part of the dielectric film 160 is used as the dielectric layer 140, such that the semiconductor pillars 110 in the first doped region I are protected by the dielectric layer 140, and the semiconductor pillars 110 in the second doped region III are protected by the insulating film 180, which may prevent the subsequent process for forming the word lines 120 from causing damage to the semiconductor pillars 110 in the second doped region III.

In some embodiments, the initial insulating film may be formed by means of a chemical vapor deposition process, and the initial insulating film 180 is patterned to form the insulating film 180 having the etching window 181. A material of the initial insulating film may be the same as the material of the insulating layer 130, and the insulating film 180 and the insulating layer 130 made of the same material have matched lattice constants, such that there may be a larger adhesion between the insulating film 180 formed by means of the deposition process and the insulating layer 130. In addition, the insulating film 180 in contact with the semiconductor pillars 110 also further improves the structural reliability of the insulating film 180, which is advantageous to preventing the insulating film 180 from falling off.

Figure 25:
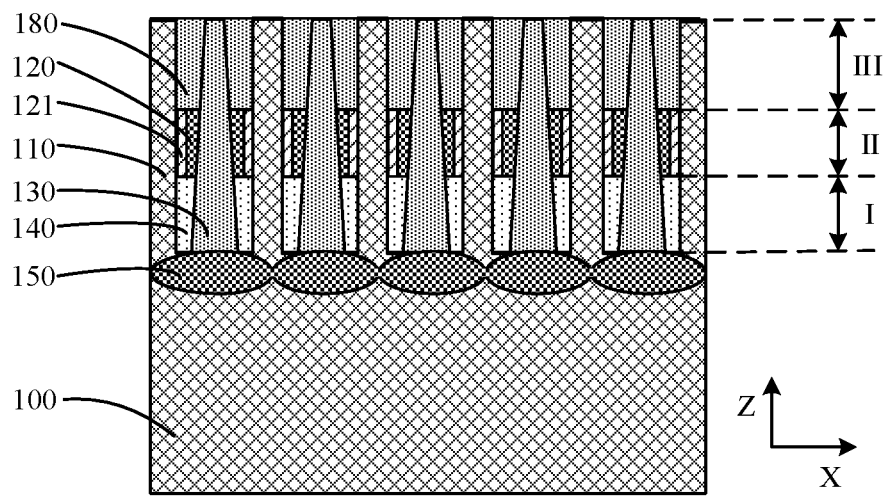

Referring to FIG. 25, in some embodiments, the gate dielectric layer 121 and the word lines 120 are formed forming by means of the etching window 181. After forming the word lines 120, the method further includes: using the insulating film 180 as a first word line capping layer, and forming a second word line capping layer in the etching window 181, to form a word line capping layer configured to cap top surfaces of the word lines 120, where the word line capping layer includes the first word line capping layer and the second word line capping layer. The etching window 181 is filled with the second word line capping layer, which may prevent the subsequent fabrication process from causing damage to the word lines 120 by means of the etching window 181. Moreover, the insulating film 180 is directly used as part of the word line capping layer, which is advantageous to reducing the difficulty of fabrication of the word line capping layer.

In the method for forming the semiconductor structure provided by the above embodiments, the semiconductor pillar 110 on the substrate 100 is configured to form the semiconductor channel of the transistor. The semiconductor pillars 110 include a first doped region I, a channel region II and a second doped region III sequentially arranged along a direction distant from a surface of the substrate 100, where the semiconductor pillars 110 in the channel region II are configured to form a channel region in the semiconductor channel of the transistor, and the word lines 120 extending along the first direction Y surround the semiconductor pillars 110 in the channel region II. In the process of forming the word lines 120, first, along the direction distant from the surface of the substrate 100, the dielectric film 160 with a gradually increased width perpendicular to the first direction Y is formed, and then the insulating layer 130 is formed in the region where the pitch between the dielectric films 160 perpendicular to the first direction Y is gradually reduced, such that along the direction distant from the surface of the substrate 100, the width of the insulating layer 130 perpendicular to the first direction Y is gradually reduced, and the top of the groove between the insulating layer 130 and the semiconductor pillars 110 has a larger opening, which is advantageous to reducing the difficulty of filling the word lines 120 in the groove, to avoiding material breakage of the word lines 120, and to forming the word lines 120 with better continuity.

Those of ordinary skill in the art can understand that the above-mentioned embodiments are some embodiments for realizing the present disclosure, but in practical applications, various changes may be made to them in form and details without departing from the spirit and scope of the present disclosure. Any person skilled in the art can make their own changes and modifications without departing from the spirit and scope of the present disclosure. Therefore, the protection scope of the present disclosure shall be subject to the scope defined by the claims.

What is claimed is:

1. A semiconductor structure, comprising:
   a substrate, the substrate being provided with a plurality of semiconductor pillars arranged at intervals, the plurality of semiconductor pillars comprising a first doped region, a channel region and a second doped region sequentially arranged along a direction distant from a surface of the substrate; and
   a plurality of word lines extending along a first direction and an insulating layer between adjacent two of the plurality of word lines, each of the plurality of word lines surrounding the channel region of the plurality of semiconductor pillars arranged along the first direction, and along the direction distant from the surface of the substrate, a width of the insulating layer perpendicular to the first direction gradually decreasing;
   a plurality of dielectric layers extending along the first direction, the plurality of dielectric layers surrounding the first doped region of the plurality of semiconductor pillars arranged along the first direction, and the plurality of word lines being positioned on top surfaces of the plurality of dielectric layers, and the insulating layer being further positioned between adjacent two of the plurality of dielectric layers.

2. The semiconductor structure according to claim 1, wherein a width of a top surface of the insulating layer perpendicular to the first direction is 10-20 nm, and a width of a bottom surface of the insulating layer perpendicular to the first direction is 15-30 nm.

3. The semiconductor structure according to claim 1, further comprising: a plurality of bit lines extending along a second direction, each of the plurality of bit lines being positioned between the plurality of semiconductor pillars arranged along the second direction and the substrate, and the plurality of bit lines being electrically connected to the first doped region; and
   an isolation layer, wherein the isolation layer is positioned between adjacent two of the plurality of bit lines.

4. The semiconductor structure according to claim 1, further comprising: a gate dielectric layer, the gate dielectric layer surrounding side surfaces of the plurality of semiconductor pillars in the channel region and being positioned between the plurality of word lines and the plurality of semiconductor pillars.

5. The semiconductor structure according to claim 1, further comprising: a word line capping layer, the word line capping layer being configured to cap top surfaces of the plurality of word lines.

6. The semiconductor structure according to claim 5, wherein the top surface of the insulating layer is lower than a top surface of the word line capping layer, and the word line capping layer is further positioned on the top surface of the insulating layer.

7. The semiconductor structure according to claim 5, wherein a top surface of the insulating layer is flush with a top surface of the word line capping layer.

8. The semiconductor structure according to claim 1, wherein an air gap is formed in the insulating layer.

9. A method for forming a semiconductor structure, comprising:
   providing a substrate, the substrate being provided with a plurality of semiconductor pillars arranged at intervals, the plurality of semiconductor pillars comprising a first doped region, a channel region and a second doped region sequentially arranged along a direction distant from a surface of the substrate; and
   forming a plurality of word lines extending along a first direction and an insulating layer between adjacent two of the plurality of word lines, each of the plurality of word lines surrounding the channel region of the plurality of semiconductor pillars arranged along the first direction, and along the direction distant from the surface of the substrate, a width of the insulating layer perpendicular to the first direction gradually decreasing;
   wherein before forming the plurality of word lines and the insulating layer, the method further comprises:
   forming a plurality of dielectric films extending along the first direction, the plurality of dielectric films being configured to cap the plurality of semiconductor pillars arranged along the first direction and being configured to fill a region between adjacent two of the plurality of semiconductor pillars arranged along the first direction; and
   along the direction distant from the surface of the substrate, a pitch between adjacent two of the plurality of dielectric films perpendicular to the first direction gradually decreasing.

10. The method for forming the semiconductor structure according to claim 9, wherein
    the plurality of dielectric films comprise a first dielectric film, a second dielectric film, and a third dielectric film; and the forming the plurality of dielectric films comprises:
    forming the first dielectric film between adjacent two of the plurality of semiconductor pillars arranged along the first direction;
    forming the second dielectric film on top surfaces of the plurality of semiconductor pillars and a top surface of the first dielectric film; and
    forming the third dielectric film configured to cap the plurality of semiconductor pillars, the first dielectric film and the second dielectric film.

11. The method for forming the semiconductor structure according to claim 9, wherein before forming the plurality of word lines and the insulating layer, the method further comprises: forming a plurality of bit lines extending along a second direction, each of the plurality of bit lines being positioned between the plurality of semiconductor pillars arranged along the second direction and the substrate, and the plurality of bit lines being electrically connected to the first doped region.

12. The method for forming the semiconductor structure according to claim 9, wherein the forming the plurality of word lines and the insulating layer comprises:
forming the insulating layer between adjacent two of the plurality of dielectric films;
etching to remove the plurality of dielectric films on side surfaces of the plurality of semiconductor pillars in the channel region; and
forming the plurality of word lines on top surfaces of remaining part of the plurality of dielectric films and in a region between the side surfaces of the plurality of semiconductor pillars in the channel region and the insulating layer directly facing thereto.

13. The method for forming the semiconductor structure according to claim 12, wherein when etching to remove the plurality of dielectric films, the method further comprises: removing the insulating layer directly facing to the side surfaces of the plurality of semiconductor pillars in the second doped region.

14. The method for forming the semiconductor structure according to claim 13, wherein after forming the plurality of word lines, the method further comprises: forming a word line capping layer on top surfaces of the plurality of word lines and a top surface of the insulating layer.

15. The method for forming the semiconductor structure according to claim 12, wherein before etching to remove the plurality of dielectric films on the side surfaces of the plurality of semiconductor pillars in the channel region, the method further comprises:
etching to remove the plurality of dielectric films on the side surfaces of the plurality of semiconductor pillars in the second doped region;
forming an insulating film in a region between the side surfaces of the plurality of semiconductor pillars in the second doped region and the insulating layer directly facing thereto, the insulating film having an etching window exposing the plurality of dielectric films; and
removing the plurality of dielectric films on the side surfaces of the plurality of semiconductor pillars in the channel region by means of the etching window.

16. The method for forming the semiconductor structure according to claim 15, wherein the forming the plurality of word lines comprises: forming the plurality of word lines by means of the etching window; and after forming the plurality of word lines, the method further comprises: using the insulating film as a first word line capping layer, and forming a second word line capping layer in the etching window, to form a word line capping layer configured to cap top surfaces of the plurality of word lines, the word line capping layer comprising the first word line capping layer and the second word line capping layer.

* * * * *